United States Patent
Lo et al.

(10) Patent No.: US 11,348,877 B2
(45) Date of Patent: May 31, 2022

(54) RF SHIELDING CAN WITH INTEGRAL SPRING FINGERS

(71) Applicant: Starry, Inc., Boston, MA (US)

(72) Inventors: Ana Lo, Somerville, MA (US); Andrew Baisch, Somerville, MA (US)

(73) Assignee: Starry, Inc., Boston, MA (US)

( * ) Notice: Subject to any disclaimer, the term of this patent is extended or adjusted under 35 U.S.C. 154(b) by 0 days.

(21) Appl. No.: 17/113,433

(22) Filed: Dec. 7, 2020

(65) Prior Publication Data

US 2021/0175183 A1    Jun. 10, 2021

Related U.S. Application Data

(60) Provisional application No. 62/946,315, filed on Dec. 10, 2019.

(51) Int. Cl.
*H01L 23/552*    (2006.01)
*H05K 9/00*    (2006.01)
*H01L 23/367*    (2006.01)

(52) U.S. Cl.
CPC ........ *H01L 23/552* (2013.01); *H01L 23/3672* (2013.01); *H05K 9/0026* (2013.01)

(58) Field of Classification Search
CPC ............................ H01L 23/552; H05K 9/0026
See application file for complete search history.

(56) References Cited

U.S. PATENT DOCUMENTS

| | | | | |
|---|---|---|---|---|
| 2001/0026440 | A1* | 10/2001 | Mellberg | H05K 9/002 361/704 |
| 2003/0067757 | A1* | 4/2003 | Richardson | H01L 23/552 361/799 |
| 2004/0052064 | A1* | 3/2004 | Oliver | H01L 23/4093 361/816 |
| 2004/0062020 | A1* | 4/2004 | Leung | H05K 9/0024 361/816 |
| 2007/0211436 | A1* | 9/2007 | Robinson | H01L 23/552 361/719 |
| 2017/0181266 | A1* | 6/2017 | Hunt | H05K 7/20409 |

* cited by examiner

*Primary Examiner* — Hung V Ngo
(74) *Attorney, Agent, or Firm* — HoustonHogle LLP

(57) ABSTRACT

The proposed design concerns RF shielding can that has the benefits of an RF can, but without compromising the thermal design of the system.

10 Claims, 3 Drawing Sheets

RF SHIELDING CAN WITH INTEGRAL SPRING FINGERS

RELATED APPLICATIONS

This application claims the benefit under 35 USC 119(e) of U.S. Provisional Application No. 62/946,315, filed on Dec. 10, 2019, which is incorporated herein by reference in its entirety.

BACKGROUND OF THE INVENTION

In the process of designing and fabricating most electronic devices, printed circuit boards (PCBs) are populated with electronic components including integrated circuit (IC) chips and discrete components, often using processes such as Plated Through Hole (PTH) and Surface Mounted Technology (SMT). The electronic components are placed and soldered onto the blank PCB board. This results in the printed circuit assembly (PCBA).

Some of the components on the PCB may be radio frequency (RF) noise sources and/or may be sensitive to RF noise from other components. Thus, some components or groups of components will need dedicated shielding to address electromagnetic interference (EMI). The object of the shielding is to surround the components with a Faraday cage.

RF cans are a standard Faraday shielding technology used in the electronics industry. They are preferable to solid metal housings since they are soldered directly to the PCB, take up minimal space, are lightweight, and low cost.

SUMMARY OF THE INVENTION

Nevertheless, the use of RF cans is limited when designing for high power, temperature sensitive electronic components and/or power generating components. Such components will typically need a heat sink. Thus, the RF cans add an additional interface between the components and heatsink, effectively increasing the thermal resistance. Thus, heat is retained in the components causing them to reach higher temperatures.

The proposed design concerns an RF shielding can that has the benefits of an RF can, but without compromising the thermal design of the system.

In general, according to one aspect, the invention features an RF can, possibly in addition to a compatible shielded heatsink encasement (SHE), that interface with each other.

In particular, the invention features an electromagnetic interference (EMI) sealing system, comprising a radio frequency (RF) can including fingers and a heatsink encasement that is installed on the RF can and deforms the can ensuring contact between the heatsink encasement and the RF can.

Preferably, the can is fabricated from spring metal, such as nickel silver.

The can could comprise a wall extending vertically from a printed circuit board on which the RF can installed and fingers projecting horizontally from the wall.

Often, there are 3 or more fingers on each side of the wall. In addition, trapezoidal shaped fingers are located at corners of the wall. Then, the encasement includes a stepped channel formed into an underside, in which a lip of the channel engages a top surface of the fingers to deform the fingers downward.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1A:
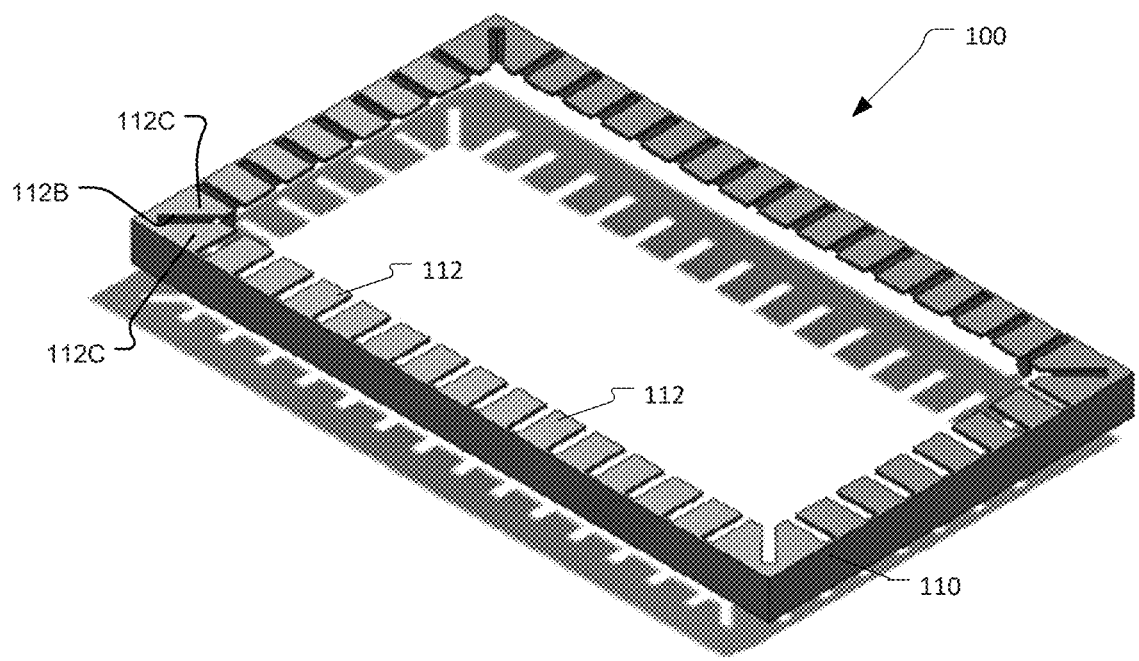
FIG. 1A is a perspective view of an RF can for a PCBA according to the present invention.

FIG. 1A shows the RF can 100 for a PCBA, which has been constructed according to the principles of the present invention.

It includes rectangular wall 110 defining a perimeter. It generally projects vertically with respect to the PCB on which the can is to be installed. At the top of the wall 110, a series of integrally formed rectangular fingers 112 project inward from the outer perimeter of the wall 100 in a direction generally parallel to the PCB on which the can is to be installed.

At the corners of the wall 110, corner fingers 112C are trapezoidal-shaped such that gap 112B between the corner fingers bisects the corner of the wall 110.

Typically, the wall 110 will have at least 3 fingers along each side. As illustrated, the shorter sides of the wall 110 have more than 5 fingers. Longer sides have more than 10 fingers.

Figure 1B:
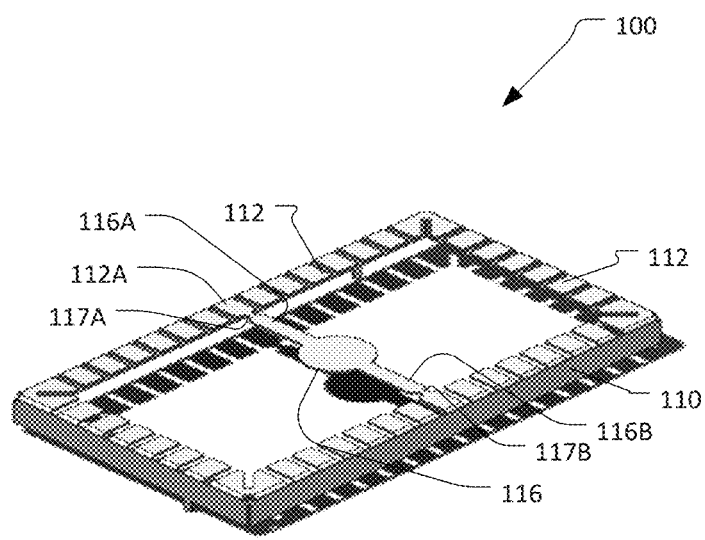
FIG. 1B is a perspective view of another embodiment of the RF can.

FIG. 1B shows another embodiment of the RF can 100. This design is compatible with the current automated PCB assembly method (pick-and-place process). The RF can is manufactured with a pick-and-place spot 116. This spot 116 is supported by two arms 116A, 116B in the center of the can. The two arms 116A, 116B terminate at two opposed fingers 112A, 112B, on either lateral side of the can. At the interfaces between the two arms 116A, 116B and the respective fingers 112A, 112B are necked-down portions 117A, 117B, that allow easy removal of the spot 116 by breaking the fingers at these locations. This spot is typically removed after the PCB assembly.

Figure 2A:
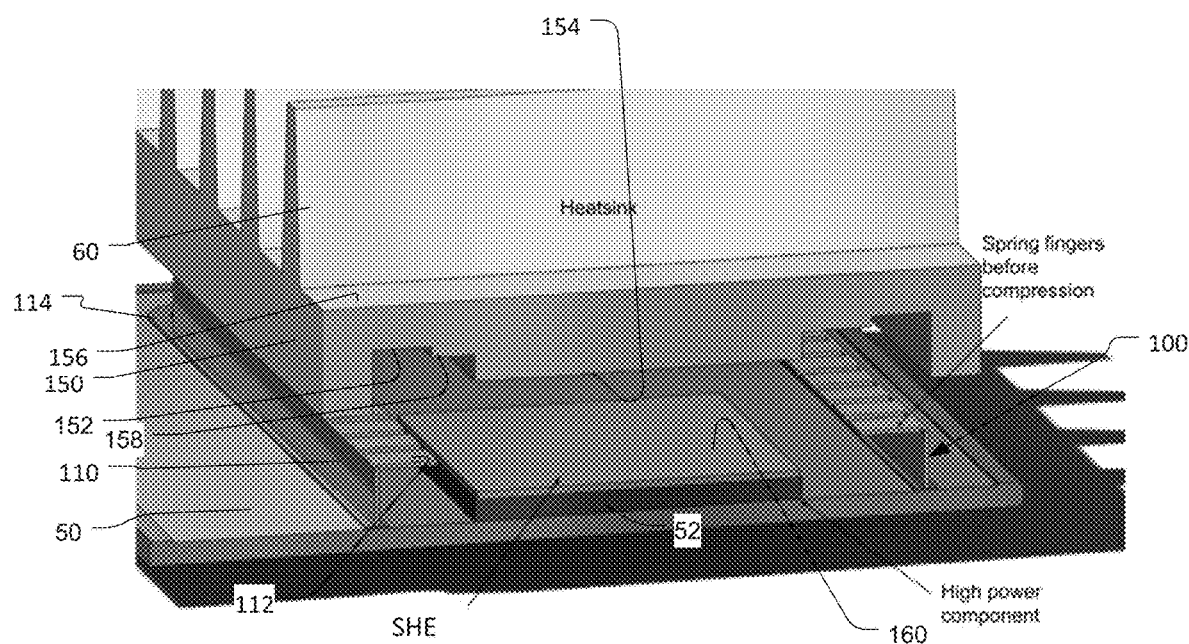
FIG. 2A is an exploded partial cross sectional view and FIG. 2B is a partial cross sectional view showing the PCBA with the RF can interfacing with a shielded heatsink encasement (SHE) frame between the heatsink and the high power integrated circuit component(s) installed on the PCB.
Figure 2B:
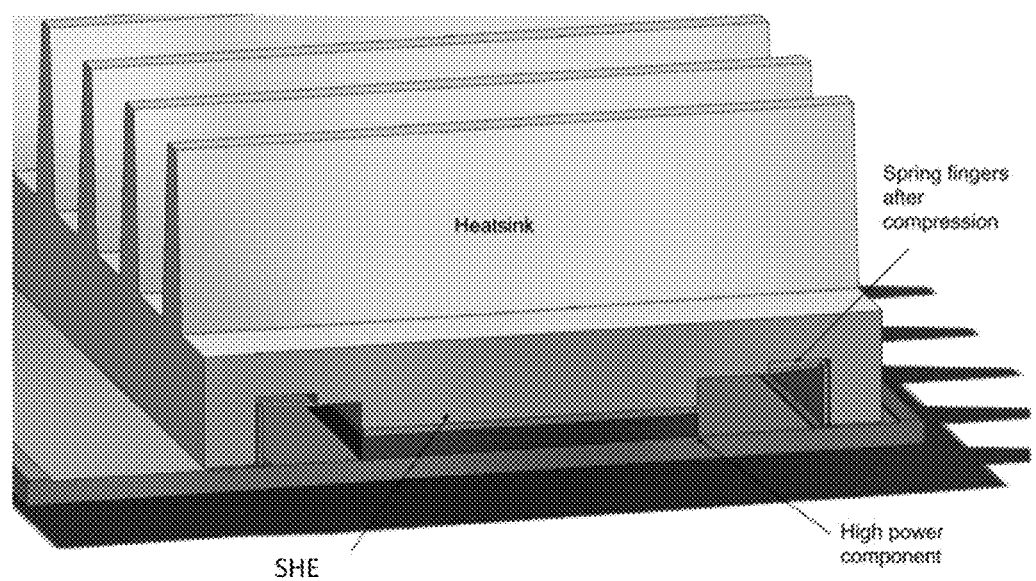

As shown in FIGS. 2A and 2B, the RF can 100 interfaces with the SHE frame 150. Briefly, the SHE frame 150 is thermally mated to the high power components, including one or more integrated circuit IC chips 52, which are mounted to the PCB 50. A thermal interface material layer 160 is typically used between an underside pedestal 154 and the top faces of the IC chips 52. A heatsink 60 is then attached to the top face 156 of the SHE frame.

The RF can 100 is preferably bonded to the top surface of the PCB 50 by a solder trace 114 and further mates with the SHE frame 150. Specifically, the SHE frame 150 includes an underside stepped channel 152 running around the lower side of the SHE frame 150. The RF can 100 and specifically its fingers fit within the stepped channel 152. An inner lip 158 of the channel engages the distal ends of the fingers 112, bending them downward when fully installed. This creates an electromagnetic interference (EMI) seal. This provides metal-to-metal contact, ensuring an EMI seal between the can fingers 112 and SHE frame 150.

Figure 3:
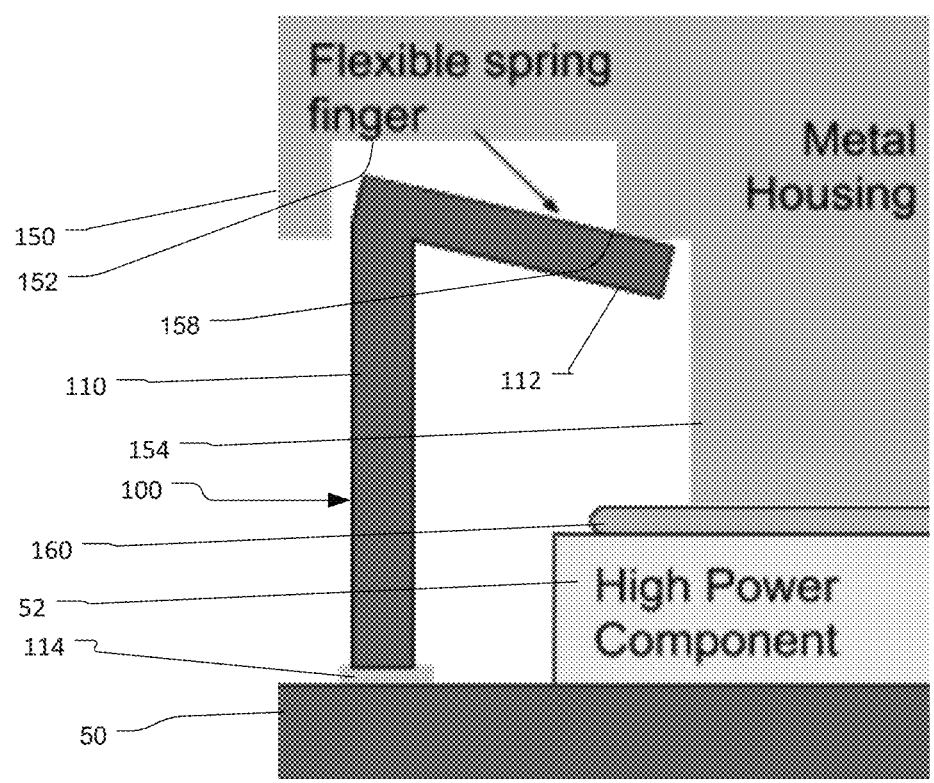
FIG. 3 is a schematic side partial cross sectional view of the RF can interfacing between a PCB and a heat sink around a high power component.

As shown in FIG. 3, these fingers 112 are cold manufactured into the wall by methods including but not limited to stamping of the RF can 100 and are elastically deformed by the inner lip 158 to absorb the tolerance stack, eliminating the need for additional gasketing.

As a result, the RF can 100 is preferably made of a relatively elastic swing metal alloy in order to prevent plastic deformation of the fingers during compression. Prototypes were designed in nickel silver.

While this invention has been particularly shown and described with references to preferred embodiments thereof, it will be understood by those skilled in the art that various changes in form and details may be made therein without departing from the scope of the invention encompassed by the appended claims.

What is claimed is:

1. An electromagnetic interference (EMI) sealing system, comprising
   a radio frequency (RF) can including a wall extending vertically from a printed circuit board on which the RF can is installed, and fingers projecting horizontally from the wall, in which each side of the wall has more than 3 fingers, and
   a heatsink encasement that is installed on the RF can and having an underside pedestal and a channel around the pedestal that deforms the fingers of the can ensuring contact between the heatsink encasement and the RF can.

2. The system of claim 1, wherein the can is fabricated from spring metal.

3. The system of claim 1, wherein the can is fabricated from nickel silver.

4. The system of claim 1, further comprising trapezoidal shaped fingers at corners of the wall.

5. The system of claim 1, wherein the channel of the encasement is a stepped channel formed into the underside.

6. An electromagnetic interference (EMI) sealing system, comprising:
   a radio frequency (RF) can including a wall extending vertically from a printed circuit board on which the RF can is installed, and fingers projecting horizontally from the wall; and
   a heatsink encasement including a stepped channel formed into an underside that is installed on the RF can and deforms the can ensuring contact between the heatsink encasement and the RF can, in which a lip of the channel engages a top surface of the fingers to deform the fingers downward.

7. The system of claim 6, wherein the can is fabricated from spring metal.

8. The system of claim 6, wherein the can is fabricated from nickel silver.

9. The system of claim 6, further comprising more than 3 fingers on each side of the wall.

10. The system of claim 6, further comprising trapezoidal shaped fingers at corners of the wall.

* * * * *